United States Patent
Huang (10) Patent No.: US 9,859,483 B2
(45) Date of Patent: Jan. 2, 2018

(54) FLIP-CHIP LIGHT EMITTING DIODE AND METHOD FOR MANUFACTURING THE SAME

(71) Applicant: Hsiu Chang Huang, New Taipei (TW)

(72) Inventor: Hsiu Chang Huang, New Taipei (TW)

( * ) Notice: Subject to any disclaimer, the term of this patent is extended or adjusted under 35 U.S.C. 154(b) by 25 days.

(21) Appl. No.: 14/985,500

(22) Filed: Dec. 31, 2015

(65) Prior Publication Data
US 2016/0240760 A1 Aug. 18, 2016

(30) Foreign Application Priority Data

Feb. 17, 2015 (TW) .............................. 104105474 A
Sep. 10, 2015 (TW) .............................. 104129927 A (51) Int. Cl.
*H01L 33/00* (2010.01)
*H01L 33/64* (2010.01)
(Continued)

(52) U.S. Cl.
CPC ............ *H01L 33/644* (2013.01); *H01L 24/97* (2013.01); *H01L 33/38* (2013.01); *H01L 33/62* (2013.01);
(Continued)

(58) Field of Classification Search
CPC ......... H01L 2924/181; H01L 2924/183; H01L 2924/00012; H01L 2224/10;
(Continued)

(56) References Cited

U.S. PATENT DOCUMENTS 6,005,276 A * 12/1999 Forrest .............. H01L 31/02005
257/432
6,531,328 B1 * 3/2003 Chen ...................... H01L 24/97
438/106
(Continued)

FOREIGN PATENT DOCUMENTS

CN 2030559978 U * 7/2013
CN 203721757 U * 7/2014
(Continued)

OTHER PUBLICATIONS

Search Report dated Jun. 22, 2016 in corresponding European Patent Application EP 16155278, 3 pages total.
(Continued)

*Primary Examiner* — Long K Tran
(74) *Attorney, Agent, or Firm* — Bacon & Thomas, PLLC (57) ABSTRACT

This invention relates to a flip-chip light-emitting diode and a method for manufacturing the same. The flip-chip light-emitting diode comprises a packaging body and a conductor layer. At least one light-emitting diode chip is encapsulated in the packaging body. The light emitting diode chip has a positive electrode and a negative electrode which are exposed on a side surface of the packaging body. The conductor layer is disposed on the side surface of the packaging body and directly in contact with the positive electrode and the negative electrode of the light-emitting diode chip. The conductor layer has circuit patterns and an insulating portion insulating the positive electrode and the negative electrode of the light-emitting diode chip from each other.

4 Claims, 11 Drawing Sheets

(51) Int. Cl.
*H01L 33/62* (2010.01)
*H01L 23/00* (2006.01)
*H01L 33/38* (2010.01)

(52) U.S. Cl.
CPC .... *H01L 2224/16* (2013.01); *H01L 2924/181* (2013.01); *H01L 2933/0016* (2013.01); *H01L 2933/0066* (2013.01); *H01L 2933/0075* (2013.01)

(58) Field of Classification Search
CPC ............... H01L 2224/16; H01L 24/97; H01L 2933/0016; H01L 2933/0066; H01L 2933/0075; H01L 33/36; H01L 33/38; H01L 33/48; H01L 33/52; H01L 33/62; H01L 33/64; H01L 33/644
USPC .............................................. 257/99; 438/22
See application file for complete search history.

(56) References Cited

U.S. PATENT DOCUMENTS

| | | | |
|---|---|---|---|
| 7,205,648 B2 | 4/2007 | Shei et al. | |
| 9,064,856 B1* | 6/2015 | Huang | H01L 23/49555 |
| 2004/0238836 A1 | 12/2004 | Lin et al. | |
| 2005/0199899 A1 | 9/2005 | Lin et al. | |
| 2006/0060867 A1* | 3/2006 | Suehiro | H01L 33/56 |
| | | | 257/81 |
| 2006/0163596 A1* | 7/2006 | Kim | G02F 1/133603 |
| | | | 257/98 |
| 2006/0220036 A1* | 10/2006 | Lee | H01L 33/486 |
| | | | 257/81 |
| 2007/0007540 A1* | 1/2007 | Hashimoto | H01L 33/642 |
| | | | 257/94 |
| 2007/0200119 A1 | 8/2007 | Li et al. | |
| 2011/0018019 A1* | 1/2011 | Wang | H01L 21/561 |
| | | | 257/98 |
| 2012/0228745 A1* | 9/2012 | Wu | H01L 23/3677 |
| | | | 257/621 |
| 2012/0241801 A1 | 9/2012 | Lai | |
| 2015/0340575 A1* | 11/2015 | Nakabayashi | H01L 33/486 |
| | | | 257/91 |
| 2016/0225965 A1* | 8/2016 | Chien | H01L 33/58 |

FOREIGN PATENT DOCUMENTS

| | | | |
|---|---|---|---|
| CN | 203932106 U | * | 11/2014 |
| CN | 104821369 U | * | 8/2015 |
| DE | 102013207611 A1 | | 10/2014 |
| EP | 2124265 A2 | | 11/2009 |
| TW | I493760 B | | 7/2015 |
| TW | I499092 B | | 9/2015 |
| WO | 2012061182 A1 | | 5/2012 |

OTHER PUBLICATIONS

Search Opinion dated Jun. 22, 2016 in corresponding European Patent Application EP 16155278, 4 pages total.

Office communication issued Jun. 22, 2016 in corresponding European Patent Application EP 16155278, 1 page total.

Search Report dated May 20, 2016 in corresponding Taiwanese Patent Application 104129927 with English translation; 5 pages total.

* cited by examiner

FLIP-CHIP LIGHT EMITTING DIODE AND METHOD FOR MANUFACTURING THE SAME

BACKGROUND OF INVENTION

1. Field of Invention

The present invention relates to a flip-chip light-emitting diode and a method for manufacturing the same, in particular to a flip-chip light-emitting diode and a method for manufacturing the same which can reduce a manufacturing cost and improve heat dissipating efficiency.

2. Related Prior Art

When compared with a conventional light source, light-emitting diodes (LEDs) are widely used as a light source due to its high light emitting efficiency and low power consumption. In a practical application, a light-emitting diode device is formed by assembling a plurality of light-emitting diode chips to the same substrate in a parallel manner or a series manner for achieving a light emitting effect. However, a lot of heat is produced when the plurality of light-emitting diode chips produce light, especially in the case that the plurality of light-emitting diode chips are assembled to the same substrate in high density, in this regard, if the heat is collected on the substrate rather than dissipated outside by an efficient manner, it will cause an undesirable influence to the light-emitting diode device.

Recently, a light-emitting diode which is called flip-chip light-emitting diode is known. Such flip-chip light-emitting diode is mainly formed by arranging positive electrodes and negative electrodes of light-emitting diode chips on a side surface thereof, which faces a circuit substrate, and directly welding the positive electrodes and the negative electrodes of the light-emitting diode chips to the circuit substrate, respectively. At this time, heat produced from the light-emitting diode chips when emitting a light is transmitted through a heat conductive path formed by a solder, a conductive copper foil, an insulating ink, and a substrate body made of metal or ceramic from the positive electrodes and the negative electrodes to a heat dissipating structure and dissipates outside. In this regard, however, a thermal resistance of such heat conductive path is high, and thus, it is hard to achieve the best heat dissipating effect for the flip-chip light-emitting diode. Moreover, because of there are many elements included in the abovementioned structures, the manufacturing process thereof is complicated, and it is hard to reduce a manufacturing cost thereof.

SUMMARY OF INVENTION

In order to solve the abovementioned problems, an object of the present invention is to provide a flip-chip light-emitting diode and a method for manufacturing the same which can reduce the manufacturing cost and improve the heat dissipating efficiency.

According to a first aspect of the invention, it is provided with a method for manufacturing a flip-chip light-emitting diode, the method comprising steps of providing a packaging body including at least one light-emitting diode chip which has a positive electrode and a negative electrode that are exposed on a side surface of the packaging body; and forming a conductor on the side surface of the packaging body, wherein the positive electrode and the negative electrode of the light-emitting diode chip are insulated from each other.

According to a second aspect of the invention, it is provided with a flip-chip light-emitting diode comprising a packaging body and a conductor layer. At least one light-emitting diode chip is encapsulated in the packaging body. The light-emitting diode chip has a positive electrode and a negative electrode being exposed on a side surface of the packaging body. The conductor layer is disposed on the side surface of the packaging body and is directly in contact with the positive electrode and the negative electrode of the light-emitting diode chip, wherein the conductor layer has circuit patterns and an insulating portion that insulates the positive electrode and the negative electrode from each other.

Further features and advantages of the present invention will be understood after reviewing the following detailed descriptions and drawings of the invention.

DETAILED DESCRIPTION OF PREFERRED EMBODIMENT

First Embodiment

Figure 1:
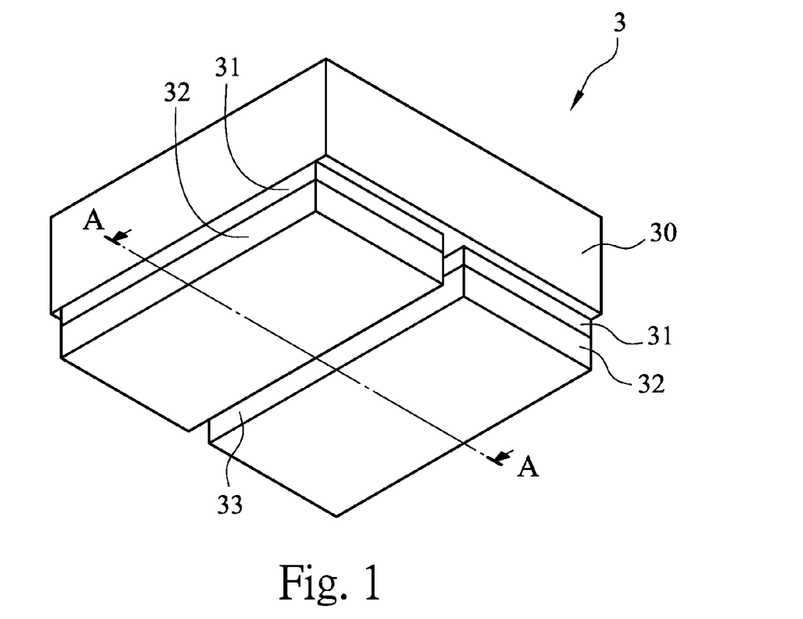
FIG. 1 is a schematic perspective view of a flip-chip light-emitting diode in accordance with a first embodiment of the present invention.
Figure 2:
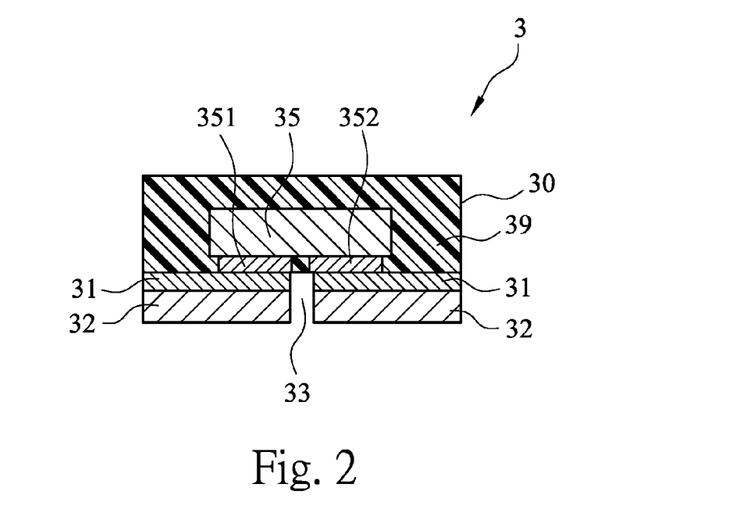
FIG. 2 is a schematic cross-sectional view taken along a line A-A in FIG. 1.

FIGS. 1 and 2 illustrate a flip-chip light-emitting diode in accordance with a first embodiment of the present invention. FIG. 1 is a schematic perspective view of the flip-chip light-emitting diode in accordance with the first embodiment of the present invention, and FIG. 2 is a schematic cross-sectional view taken along a line A-A in FIG. 1.

Referring to FIGS. 1 and 2, the flip-chip light-emitting diode 3 in accordance with the first embodiment of the present invention includes a packaging body 30, a first metal layer 31, a second metal layer 32 and an insulating portion 33. The packaging body 30 comprises light-emitting diode chips 35 encapsulated in an encapsulating material 39. Each of the light-emitting diode chips 35 has a positive electrode 351 and a negative electrode 352 which are exposed on a side surface of the packaging body 30. The first metal layer 31 is formed on the side surface of the packaging body 30 and respectively in contact with the positive electrode 351 and the negative electrode 352 of each of the light-emitting diode chips 35. The second metal layer 32 is formed on the first metal layer 31. The insulating portion 33 can be gaps formed in the first metal layer 31 and second metal layer 32 for insulating the positive electrode 351 and the negative electrode 352 of each of the light-emitting diode chips 35 from each other.

Note that, although the flip-chip light-emitting diode 3 of the present embodiment comprises two metal layers (i.e., the first metal layer 351 and the second metal layer 352), yet a skilled person in the field of the present application can realized that such two metal layers may be replaced by a single metal layer or more metal layers, and that the single or plural metal layers formed on the side surface of the packaging body may have circuit patterns. Moreover, although in the present embodiment, it merely shows that the packaging body 30 includes the light-emitting diode chips 35 encapsulated in the encapsulating material 39, yet other electric elements such as a current-limiting resistor, an over-current protection element, an electrostatic protection element, and the like that may operate together with the light-emitting diode chips 35 can also be encapsulated in the encapsulating material 39.

Next, two different methods for manufacturing the flip-chip light-emitting diode in accordance with the first embodiment of the present invention will be described.

Figure 3:
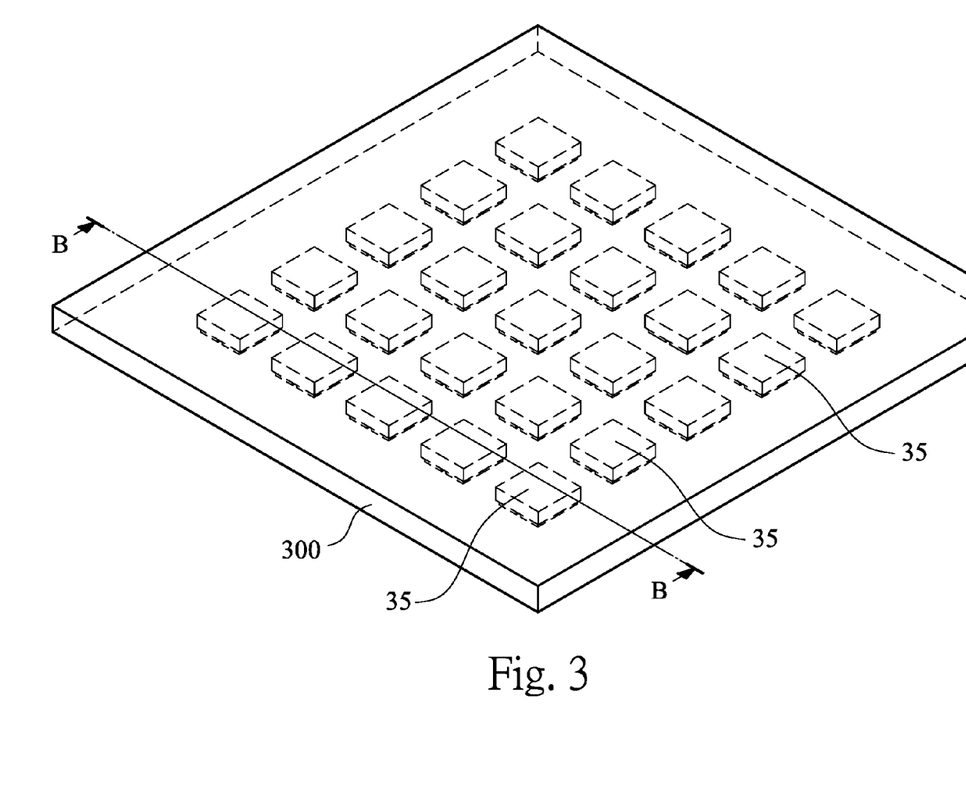
FIG. 3 is a schematic perspective view of a packaging body in accordance with the present invention.

Referring to FIGS. 3, 4A to 4G and 5, a first method for manufacturing the flip-chip light-emitting diode in accordance with the first embodiment of the present invention will be described. FIG. 3 is a schematic perspective view of a packaging body 300. FIGS. 4A to 4G are schematic views for illustrating steps of the first method for manufacturing the flip-chip light-emitting diode of the first embodiment of the present invention.

Figure 4A:
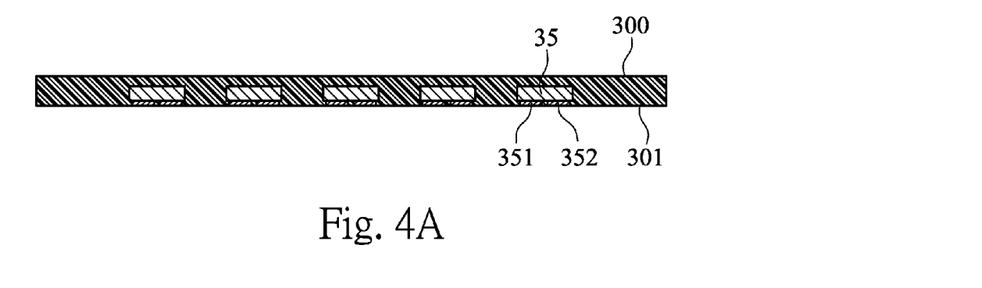
FIGS. 4A to 4G are schematic views for illustrating a first method for manufacturing the flip-chip light-emitting diode in accordance with the first embodiment of the present invention.

Firstly, as shown in FIGS. 3 and 4A, a packaging body 300 is provided. The packaging body 300 includes a plurality of light-emitting diode chips 35 which are arranged in a matrix manner, each of the light-emitting diode chips 35 has a positive electrode 351 and a negative electrode 352 that are exposed on a side surface 301 of the packaging body 300. Preferably, the light-emitting diode chip 35 can be a flip-chip light-emitting diode chip or a surface mounting device (SMD) light-emitting diode chip as long as the positive electrode and the negative electrode thereof can be exposed on the side surface of the packaging body.

Figure 4B:
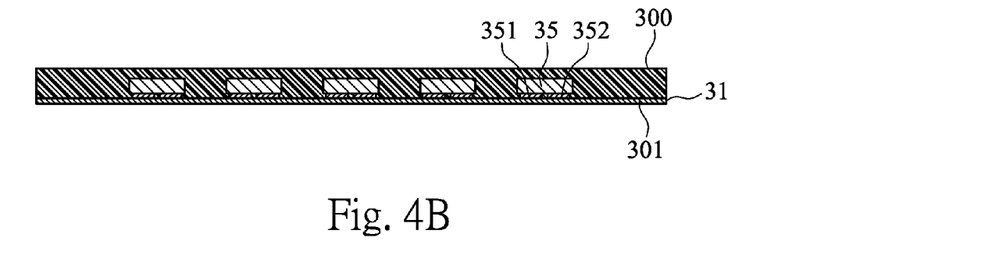
Figure 4C:
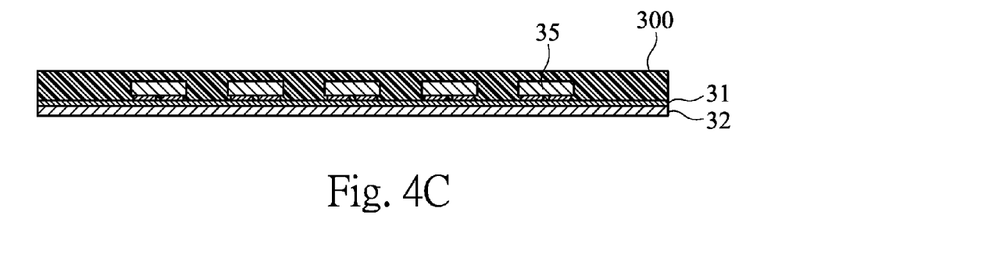

Subsequently, as shown in FIGS. 4B and 4C, a first metal layer 31 (i.e., a conductive thin layer) and a second metal layer 32 (i.e., a conductive thick layer) that are used as a conductive layer are formed on the side surface 301 of the packaging body 300 in this order. Specifically, the first metal layer 31 is directly formed on the side surface 301 of the packaging body 300 by a method of deposition, sputtering, ion beam sputtering, chemical plating or the like, and is directly in contact with the positive electrode 351 and the negative electrode 352 of each of the light-emitting diode chips 35. The second metal layer 32 is formed on the first metal layer 31 by an electroplating method. Accordingly, as the first metal layer and the second metal layer used in the present invention are directly formed on the side surface of the packaging body by the manufacturing method previously presented without using any solder, and are directly in contact with the positive electrode and the negative electrode of the light-emitting diode chip, when compared with the conventional structure that the positive electrode and the negative electrode of the light-emitting diode chip are connected to the circuit board through the solder, the present invention has advantages of a better bonding property, a thinner thickness and the like. Thus, the flip-chip light-emitting diode formed through the following steps will have flexibility and a lower thermal resistance.

Note that, although in the present embodiment, an example of the conductive layer which is made of two metal layers (i.e., the first metal layer 31 and the second metal layer 32) is given, yet the present invention is not limited thereto. For example, a single metal layer formed on the side surface of the packaging body can be used as the conductive layer.

Figure 4D:
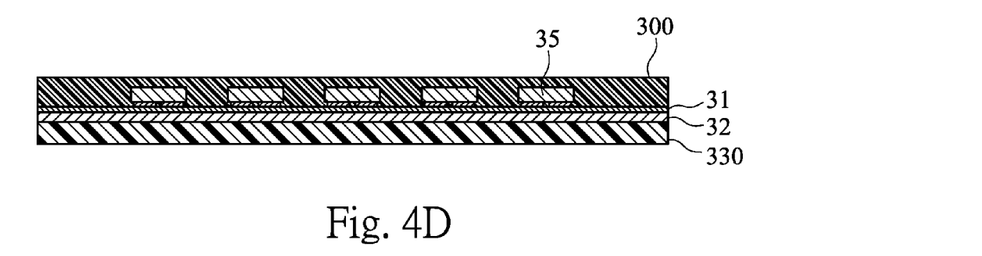
Figure 4E:
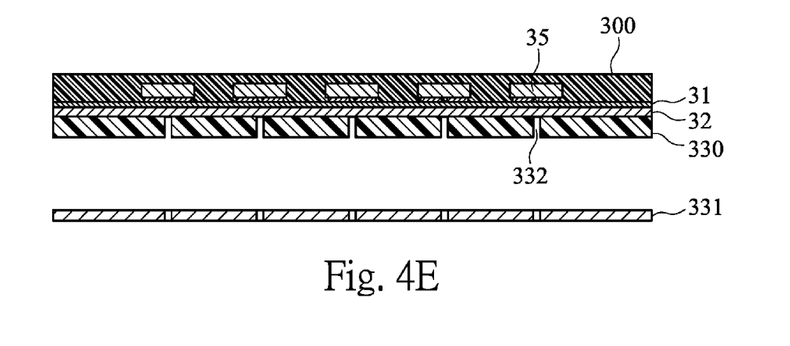
Figure 4F:
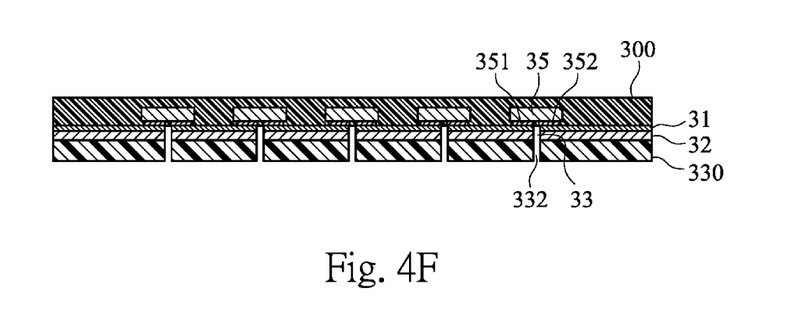
Figure 4G:
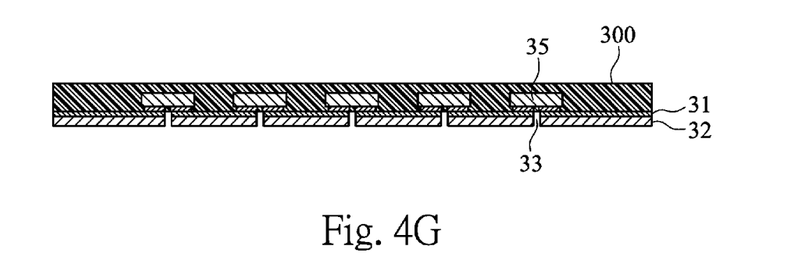

Referring to FIGS. 4D and 4G, a method of forming insulating portions 33 and circuit patterns (not shown) in the first metal layer 31 and the second metal layer 32 that are used as the conductive layer is described. As shown in FIG. 4D, a layer of photosenstive glue 330 is firstly formed on an outer surface of the second metal layer 32, and then, as shown in FIG. 4E, patterned openings 332 are formed in the layer of photosenstive glue 330 through a mask 331 by a photolithography method. Next, as shown in FIG. 4F, the first metal layer 31 and the second metal layer 32 are etched through the patterned openings 332 in the layer of photosenstive glue 330 so as to form the insulating portions 33 and the circuit patterns (not shown) in the first metal layer 31 and the second metal layer 32. The positive electrode 351 and the negative electrode 352 of each of the light-emitting diode chips 35 are insulated from each other by the insulation portions 33. In other words, in this step, the layer of photosenstive glue 330 having the patterned openings 332 is used as a mask portion for etching. Finally, as shown in FIG. 4G, the layer of photosenstive glue 330 is removed from the outer surface of the second metal layer 32. Thus, a conductor having the insulating portions and the circuit patterns is formed on the side surface 301 of the packaging body 300.

Note that, although in the present embodiment, the layer of photosenstive glue formed to have the patterned openings by the photolithography method is used as the mask portion for etching, yet the present invention is not limited thereto. For example, in order to form a mask portion for a use in the later etching process, a layer of photosenstive glue having patterned openings can also be directly printed on the outer surface of the second metal layer by a screen printing method, and then the first metal layer and the second metal layer are etched through these patterned openings. Therefore, the same effect can be obtained.

Moreover, for convenience in the later manufacturing processes, in the step of etching the first and second metal layers through the patterned openings of the layer of photosenstive glue, in addition to the insulating portions and the circuit patterns formed in the first and second metal layers, a cutting path is also formed in the first and second metal layers as indicated by arrows C and D shown in FIG. 5. And, the packaging body is cut along this cutting path such that the flip-chip light-emitting diode 3 (referring to FIGS. 1 and 2) is obtained. In this regard, however, the cutting path is not necessary in the present invention. In fact, the step of forming the cutting path in the metal layers is mainly for the purpose of making the later cutting process easier. Specifically, if the cutting path is formed in the metal layers, only the packaging body is needed to be cut. In contrast, if the cutting path is not formed in the metal layers, the packaging body and the metal layers can also be cut by the other suitable way (e.g., laser cutting, wire cutting or the like) in order to form the flip-chip light-emitting diode 3.

Note that, except forming the flip-chip light-emitting diode 3 in a single piece as shown in FIGS. 1 and 2, the cutting step as previously presented can also be used to form a one dimensional array of the flip-chip light-emitting diode (not shown) which includes a plurality of flip-chip light-emitting diodes 3 depending to requirements of applications.

On the other hand, except utilizing the abovementioned method of which the conductor is formed on the side surface of the packaging body by etching the metal layers through the mask portion, it is also possible to directly print a conductive material (e.g, a silver pasta), a conductive adhesive (e.g., an adhesive formed of a polymer material with a conductive material such as silver powder, silver-coated bronze powder, graphene, carbon nano-tube or the like) or the like to the side surface of the packaging body by a screen printing method and then curing it by a suitable way such as a high or low temperature sintering method, a thermosetting method or the like such that the conductor having circuit patterns is formed.

Next, referring to FIGS. 3, 5. 6A to 6F and 7, a second method for manufacturing the flip-chip light-emitting diode in accordance with the first embodiment of the present invention will be described. FIGS. 6A to 6F are schematic views for illustrating steps of the second method for manufacturing the flip-chip light-emitting diode of the first embodiment of the present invention, and FIG. 7 is a schematic perspective view of FIG. 6C.

Figure 6A:
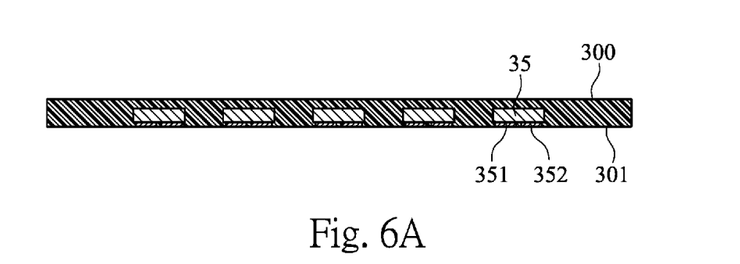
FIGS. 6A to 6F are schematic views for illustrating a second method for manufacturing the flip-chip light-emitting diode in accordance with the first embodiment of the present invention.
Figure 7:
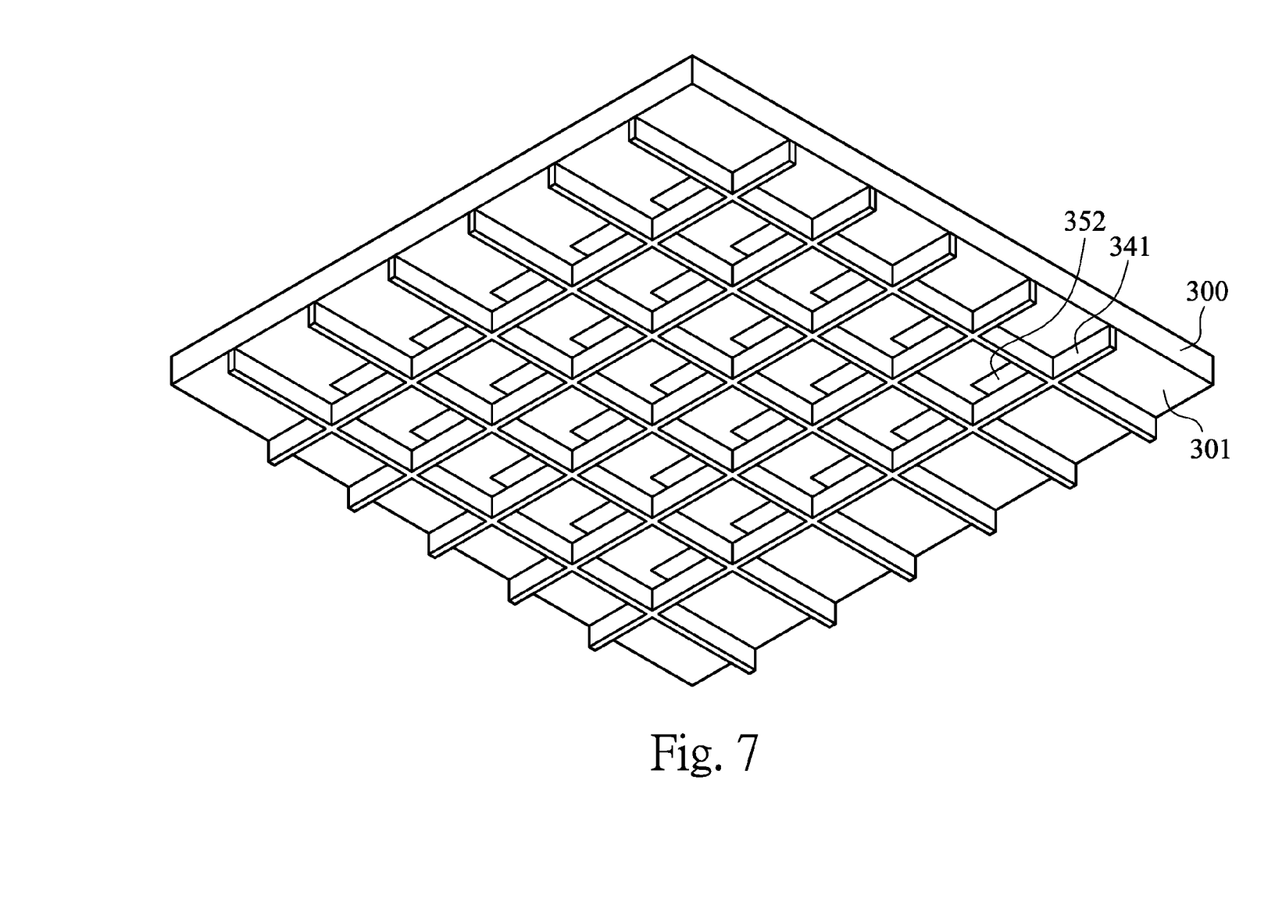
FIG. 7 is a schematic perspective view of FIG. 6C.

As shown in FIGS. 3 and 6A, the packaging body 300 is firstly provided, the packaging body 300 includes a plurality of light-emitting diode chips 35 which are arranged in a matrix manner, each of the light-emitting diode chips 35 has a positive electrode 351 and a negative electrode 352 that are exposed on a side surface 301 of the packaging body 300.

Figure 6B:
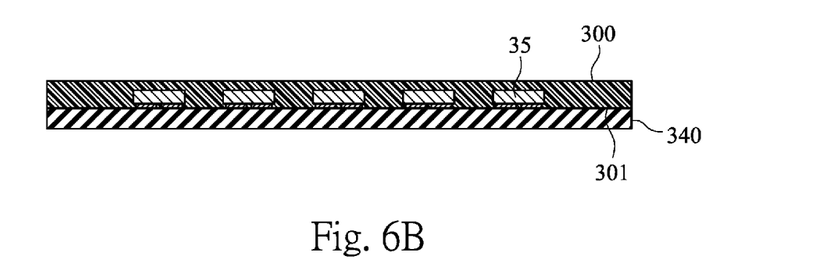
Figure 6C:
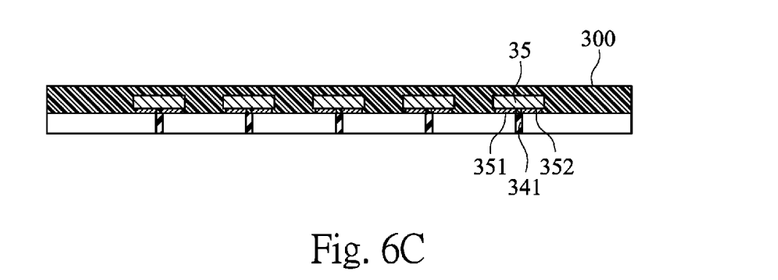

Subsequently, as shown in FIG. 6B, a layer of photosenstive glue 340 is formed on the side surface 301 of the packaging body 300, and a partition portion 341 is formed from the layer of photosenstive glue 340 on the side surface 301 of the packaging body 300 by the photolithography method, as shown in FIG. 6C. Specifically, the partition portion 341 is at least formed at locations between the positive electrode 351 and the negative electrode 352 of each of the light-emitting diode chips 35. Preferably, the partition portion 341 is also formed at locations where a cutting path of which the packaging body 300 is to be cut along. An example of the partition portion 341 on the side surface 301 of the packaging body 300 is shown in FIG. 7.

Figure 6D:
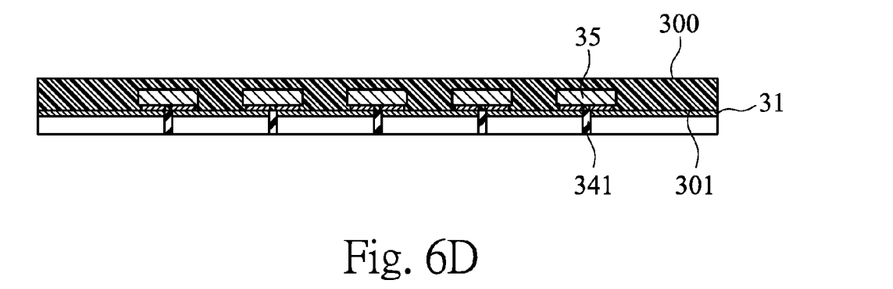
Figure 6E:
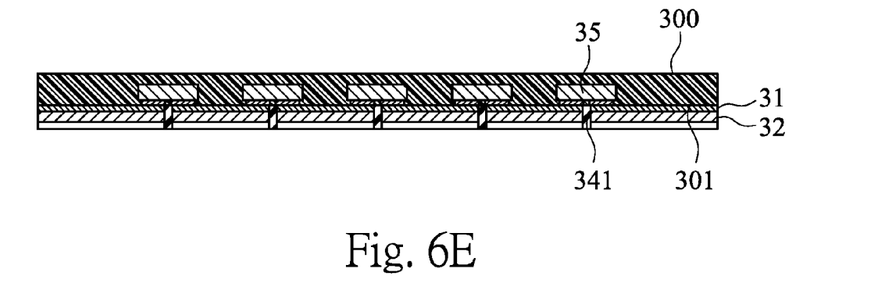

As shown in FIGS. 6D and 6E, at locations other than the locations where the partition portion 341 is formed on the side surface 301 of the packaging body 300, a first metal layer 31 (i.e., a conductive thin layer) and a second metal layer 32 (i.e., a conductive thick layer) that are used as a conductive layer are formed sequentially. Note that the first metal layer 31 and the second metal layer 32 are formed by the same methods as that used in the first method for manufacturing the flip-chip light-emitting diode in accordance with the first embodiment of the present invention, which are omitted for simplicity. Moreover, as previously stated in the first method for manufacturing the flip-chip light-emitting diode in accordance with the first embodiment of the present invention, it is unnecessary to form the first and second metal layers, a single metal layer is also can be used as the conductive layer.

Figure 5:
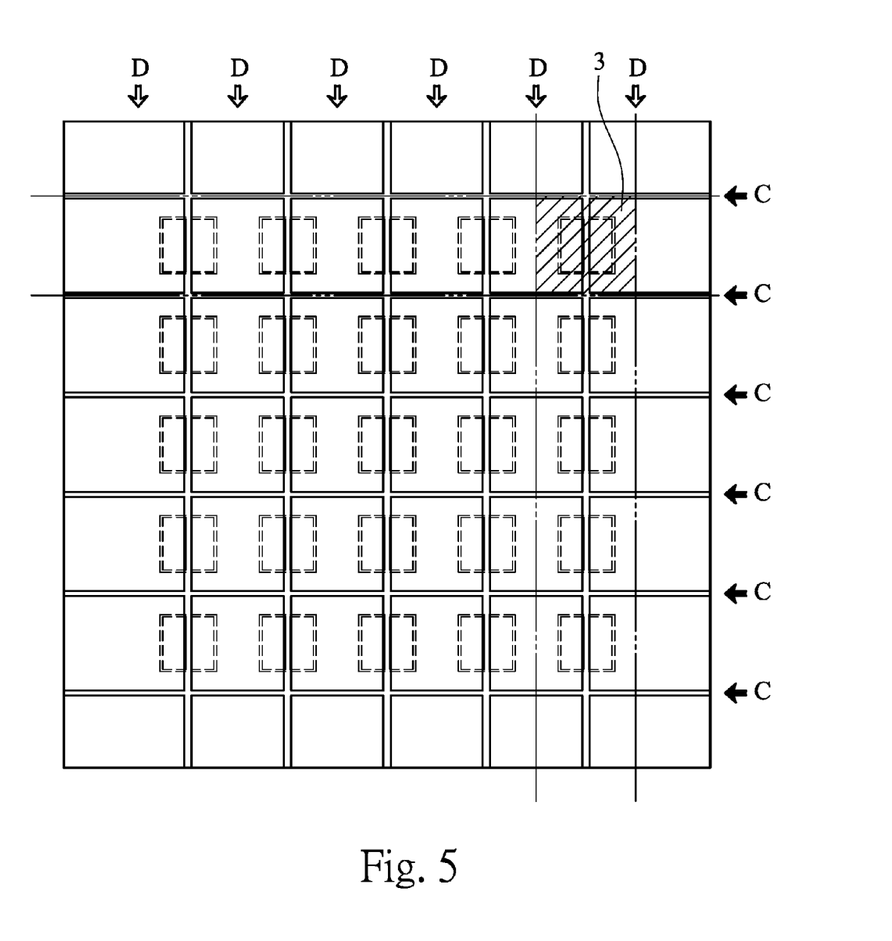
FIG. 5 is a schematic view for illustrating a cutting path.
Figure 6F:
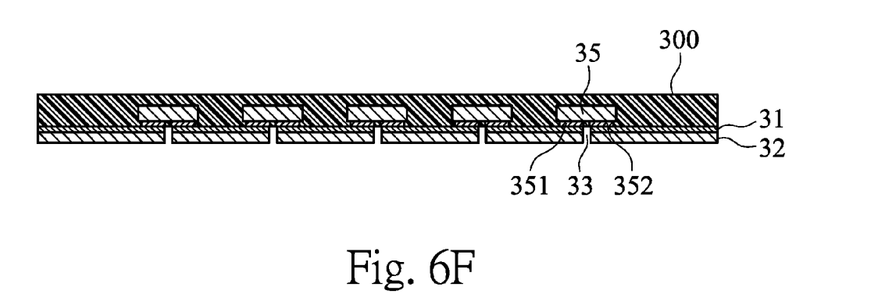

As shown in FIG. 6F, the partition portion 341 is then removed from the packaging body 300 for forming insulating portions 33 in the first metal layer 31 and the second metal layer 32 which insulate the positive electrode 351 and the negative electrode 352 of each of the light-emitting diode chips 35 from each other. At this point, the second method for manufacturing the flip-chip light-emitting diode in accordance with the first embodiment of the present invention has produced a structure that is identical with a structure of the first method shown in FIG. 4G. Finally, similar to the first method, the second method can further comprise a step of cutting the packing body along the cutting path as shown in FIG. 5 (as indicating by arrows C and D) to form the flip-chip light-emitting diode 3 (referring to FIGS. 1 and 2).

Note that, although as described in this method, the partition portion 341 is formed on the side surface 301 of the packaging body 300 by processing the layer of photosensitive glue 340 based on the photolithography method, yet the method for forming the partition portion 341 is not limited to such method. For example, the partition portion 341 can be formed by directly screen-printing photosenstive glue or heat transfer insulating adhesive on the side surface 301 of the packaging body 300. However, in the case that the heat transfer insulating adhesive is directly screen-printed on the side surface 301 of the packaging body 300 to form the partition portion 341, since an existence of the heat transfer insulating adhesive can facilitate to dissipate heat generated from the light-emitting diode chips 35, after the step of forming metal layers, it does not need to perform the step for removing the partition portion as shown in FIG. 6F.

Second Embodiment

Figure 8:
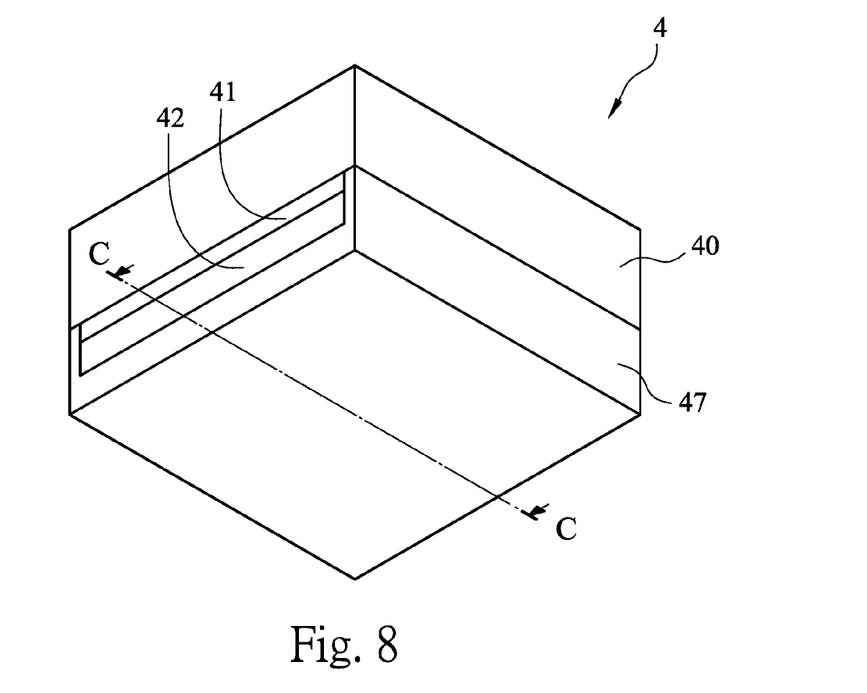
FIG. 8 is a schematic perspective view of a flip-chip light-emitting diode in accordance with a second embodiment of the present invention.
Figure 9:
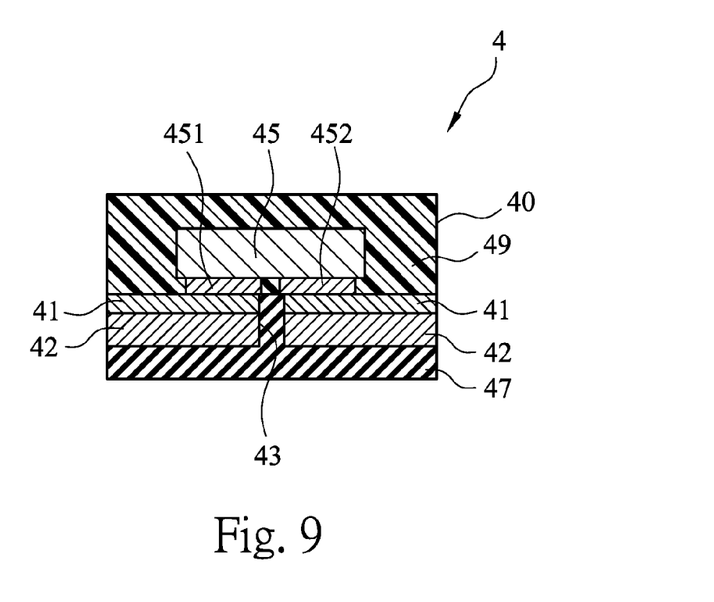
FIG. 9 is a schematic cross-sectional view taken along a line C-C in FIG. 8.

FIGS. 8 and 9 illustrate a flip-chip light-emitting diode in accordance with a second embodiment of the present invention. FIG. 8 is a schematic perspective view of the flip-chip light-emitting diode in accordance with the second embodiment of the present invention, and FIG. 9 is a schematic cross-section view taken along a line C-C of FIG. 8.

Referring to FIGS. 8 and 9, the flip-chip light-emitting diode 4 in accordance with the second embodiment of the present invention includes a packaging body 40, a first metal layer 41, a second metal layer 42, an insulating portion 43 and a layer of heat transfer insulating adhesive 47. The packaging body 40 comprises light-emitting diode chips 45 encapsulated in an encapsulating material 49. Each of the light-emitting diode chips 45 has a positive electrode 451 and a negative electrode 452 which are exposed on a side surface of the packaging body 40. The first metal layer 41 is formed on the side surface of the packaging body 40 and respectively in contact with the positive electrode 451 and the negative electrode 452 of each of the light-emitting diode chips 45. The second metal layer 42 is formed on the first metal layer 41. The insulating portion 43 may be gaps formed in the first metal layer 41 and the second metal layer 42 for insulating the positive electrode 451 and the negative electrode 452 of each of the light-emitting diode chips 45 from each other. The layer of heat transfer insulating adhesive 47 covers an outer surface of the second metal layer 42 and extends into the insulating portion 43.

Similar with the first embodiment, although in the second embodiment, the flip-chip light-emitting diode 4 comprises two metal layers (the first metal layer 41 and the second metal layer 42), yet a skilled person in the field of the present application can realized that such two metal layers may be replaced by a single metal layer or more metal layers, and that the single or plural metal layers formed on the side surface of the packaging body 40 may have circuit patterns. Moreover, although in the second embodiment, it merely shows that the packaging body 40 includes the light-emitting diode chips 45 encapsulated in the encapsulating material 49, yet other electric elements such as a current-limiting resistor, an over-current protection element, an electrostatic protection element, and the like that operate together with the light-emitting diode chips 45 can also be encapsulated in the encapsulating material 49.

Next, two different methods for manufacturing the flip-chip light-emitting diode in accordance with the second embodiment of the present invention will be described.

Figure 10A:
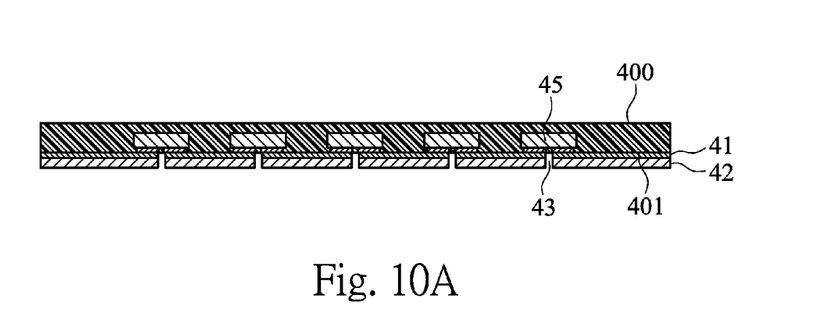
FIGS. 10A and 10B are schematic views for illustrating a first method for manufacturing the flip-chip light-emitting diode in accordance with the second embodiment of the present invention.

First of all, since a difference between the flip-chip light-emitting diode 4 of the second embodiment of the present invention and the flip-chip light-emitting diode 3 of the first embodiment of the present invention merely is that the flip-chip light-emitting diode 4 of the second embodiment has the layer of heat transfer insulating adhesive 47, a first method for manufacturing the flip-chip light-emitting diode 4 of the second embodiment comprises steps that are identical with the steps of the first method and the second method for manufacturing the flip-chip light-emitting diode of the first embodiment as respectively shown in FIGS. 4A to 4G and FIGS. 6A to 6F for forming a structure, as shown in FIG. 10A, which is identical with a structure shown in FIG. 4A or FIG. 6F.

Specifically, the structure shown in FIG. 10A includes a packaging body 400, a plurality of light-emitting diode chips 45 in the packaging body 400, a first metal layer 41 formed on a side surface 401 of the packaging body 400, a second metal layer 42 formed on the first metal layer 41, and insulating portions 43 formed in the first metal layer 41 and the second metal layer 42.

Figure 10B:
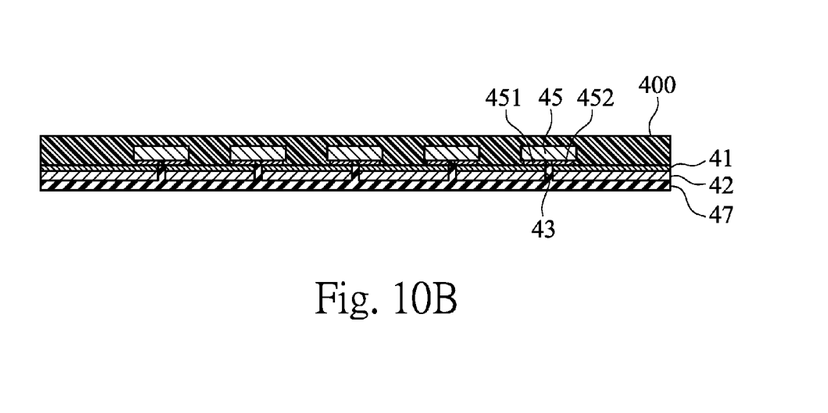

Next, a heat transfer insulating adhesive is applied to an outer surface of the second metal layer 42 and into the insulating portions 43 so as to form a layer of heat transfer insulating adhesive 47, as shown in FIG. 10B.

Finally, after forming the structure shown in FIG. 10B, a cutting step can be performed in a manner like that shown in FIG. 5 such that the flip-chip light-emitting diode 4 shown in FIGS. 8 and 9 is obtained.

Subsequently, FIGS. 11A to 11D illustrate a second method for manufacturing the flip-chip light-emitting diode in accordance with the second embodiment of the present application.

Figure 11A:
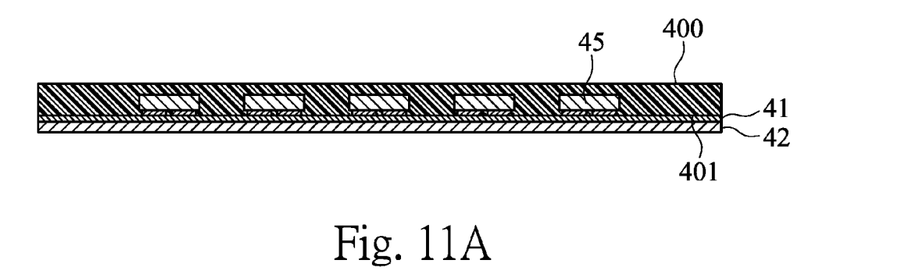
FIGS. 11A to 11D are schematic views for illustrating a second method for manufacturing the flip-chip light-emitting diode in accordance with the second embodiment of the present invention.

At beginning, steps that are identical with the steps shown in FIGS. 4A to 4C of the first method for manufacturing the flip-chip light-emitting diode of the first embodiment are used to manufacture the same structure as that in FIG. 4C, as shown in FIG. 11A. The structure shown in FIG. 11A includes a packaging body 400, a plurality of light-emitting diode chips 45 in the packaging body 400, a first metal layer 41 formed on a side surface 401 of the packaging body 400, and a second metal layer 42 formed on the first metal layer 41.

Figure 11B:
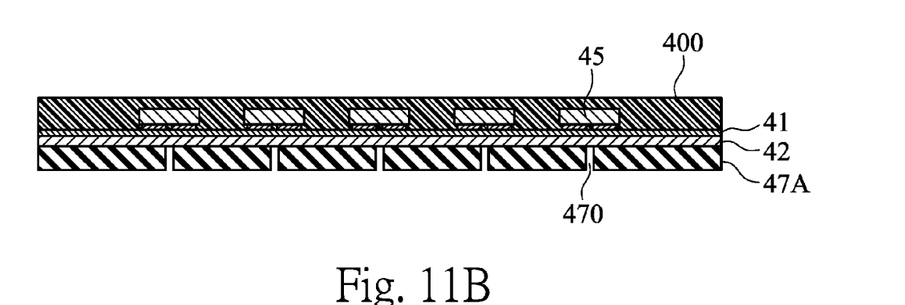
Figure 11C:
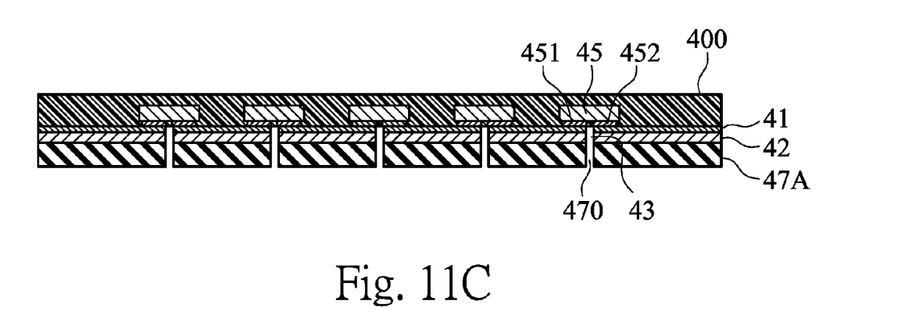

Then, a heat transfer insulating adhesive is screen-printed on an outer surface of the second metal layer 42 so as to form a layer of heat transfer insulating adhesive 47A which has patterned openings 470 therein, as shown in FIG. 11B. And, the first metal layer 41 and the second metal layer 42 are etched through the patterned openings 470 in the layer of heat transfer insulating adhesive 47A so as to form insulating portions 43 and circuit patterns (not shown), as shown in FIG. 11C, wherein the insulating portions 43 insulate the positive electrode 451 and the negative electrode 452 of each of the light-emitting diode chips 45 from each other.

Figure 11D:
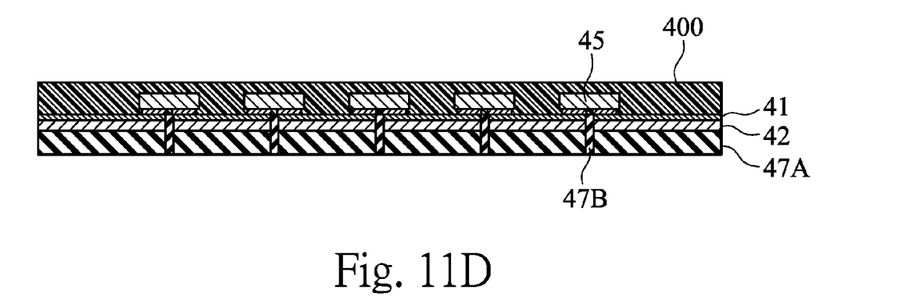

Subsequently, as shown in FIG. 11D, an additional heat transfer insulating adhesive 47B is applied into the insulating portions 43 and the patterned openings 470 of the layer of heat transfer insulating adhesive 47A. Preferably, a material of the layer of heat transfer insulating adhesive 47A is identical with that of the additional heat transfer insulating adhesive 47B, but the present invention is not limited thereto.

Finally, after finishing the step as shown in FIG. 11D, a cutting step can be performed in a manner like that shown in FIG. 5 such that the flip-chip light-emitting diode 4 shown in FIGS. 8 and 9 is obtained.

According to the above embodiments, it is understood that the flip-chip light-emitting diode proposed in the present invention only needs to include the conductor (e.g., the metal sheet, the metal layer or the like) that is directly in contact with the positive electrode and the negative electrode of the light-emitting diode chip without using any solder, and does not need to have a substrate or other elements included in the conventional flip-chip light-emitting diode, which are connected to the positive electrode and the negative electrode of the light-emitting diode chip through solders. Thus, the flip-chip light-emitting diode of the present invention can effectively lower whole heat resistance of the flip-chip light-emitting diode so as to achieve a better heat dissipating effect. Moreover, since the flip-chip light-emitting diode and the method for manufacturing the flip-chip light-emitting diode proposed in the present invention is much easier than the conventional flip-chip light-emitting diode and the method for manufacturing the conventional flip-chip light-emitting diode, the flip-chip light-emitting diode and the method for manufacturing the flip-chip light-emitting diode proposed in the present invention also have an advantage of significantly reducing the cost for manufacturing the light-emitting diode.

In view of the above, although the specific embodiments have been described, yet such embodiments merely are presented as examples and not being intended to limit the scope of the present invention. In fact, the embodiments described here can be implemented by various forms or the other different combinations. It is intended in the appended claims and the equivalents thereof to cover various forms, combinations and modifications which come within the spirit and scope of the present invention.

The invention claimed is:
1. A flip-chip light-emitting diode comprising:
a packaging body in which at least one light-emitting diode chip is encapsulated, the light-emitting diode chip having a positive electrode and a negative electrode, the positive electrode and the negative electrode being exposed flush with a side surface of the packaging body, wherein the positive electrode and the negative electrode are insulated from each other in the packaging body;
a conductor layer disposed on the side surface of the packaging body and directly in contact with the positive electrode and the negative electrode of the light-emitting diode chip, the conductor layer having circuit patterns and an insulating portion which insulates the positive electrode and the negative electrode of the light-emitting diode chip from each other; and
a heat transfer insulating layer covering an outer surface of the conductor layer and extending into the insulating portion.
2. The flip-chip light-emitting diode of claim 1, wherein the conductor layer comprises a first metal layer formed on the side surface of the packaging body and a second metal layer formed on an outer surface of the first metal layer, and wherein the heat transfer insulating layer covers an outer surface of the second metal layer and extending into the insulating portion.

3. The flip-chip light-emitting diode of claim 2, wherein the first metal layer is made by a method selected from any one of a deposition method, a sputtering method and a chemical plating method, and the second metal layer is made by an electroplating method.

4. The flip-chip light-emitting diode of claim 1, wherein the conductor layer is screen-printed onto the side surface of the packaging body.

\* \* \* \* \*